United States Patent
Ayrignac

(12) 
(10) Patent No.: US 6,681,360 B1
(45) Date of Patent: Jan. 20, 2004

(54) FAULT DETECTION METHOD FOR ELECTRONIC CIRCUIT

(75) Inventor: Renaud Ayrignac, Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/552,765

(22) Filed: Apr. 19, 2000

(30) Foreign Application Priority Data

Apr. 20, 1999 (FR) .............................................. 99 04984

(51) Int. Cl.[7] .......................... G01R 31/28; G06F 11/00
(52) U.S. Cl. ...................................... 714/735; 714/816
(58) Field of Search .......................... 714/21, 42, 724, 714/726, 732, 734, 735, 738, 811, FOR 101, 816

(56) References Cited

U.S. PATENT DOCUMENTS

| | | | | |
|---|---|---|---|---|
| 4,913,557 A | * | 4/1990 | Segawa et al. ............. | 714/731 |
| 5,572,535 A | * | 11/1996 | Pixley et al. ................ | 714/724 |
| 5,684,808 A | * | 11/1997 | Valind ......................... | 714/726 |
| 6,032,278 A | * | 2/2000 | Parvathala et al. ......... | 714/726 |
| 6,163,192 A | * | 12/2000 | Lee et al. ................... | 327/212 |
| 6,185,713 B1 | * | 2/2001 | Nakamoto et al. .......... | 714/734 |

FOREIGN PATENT DOCUMENTS

| DE | 3108870 | 9/1982 | ........... G06F/11/26 |
|---|---|---|---|

* cited by examiner

*Primary Examiner*—Albert Decady
*Assistant Examiner*—Matthew C. Dooles
(74) *Attorney, Agent, or Firm*—Lisa K. Jorgenson; Allen, Dyer, Doppelt, Milbrath & Gilchrist, P.A.

(57) ABSTRACT

A method and device for detecting faults in an electronic circuit, such as a multiplexed latch includes n control inputs, p data inputs, and at least one output. The method involves trying to cause the electronic circuit to function to modify the state of the output with respect to a start state, knowing that if the state of the output effectively changes while the control inputs are inhibited, this means that at least one control input is stuck at logic 1.

29 Claims, 1 Drawing Sheet

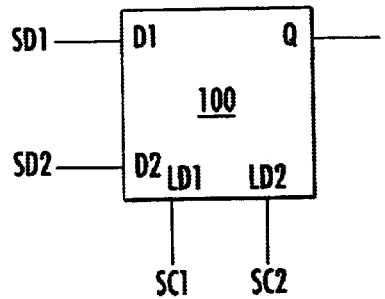
FIG. 1
(PRIOR ART)
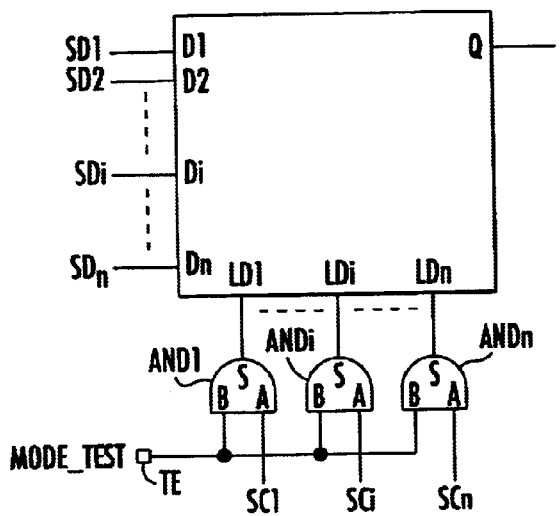
FIG. 2
(PRIOR ART)
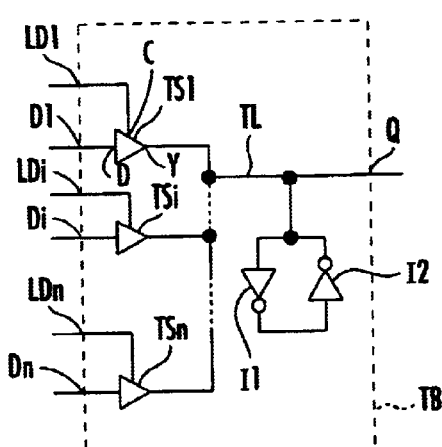
FIG. 3
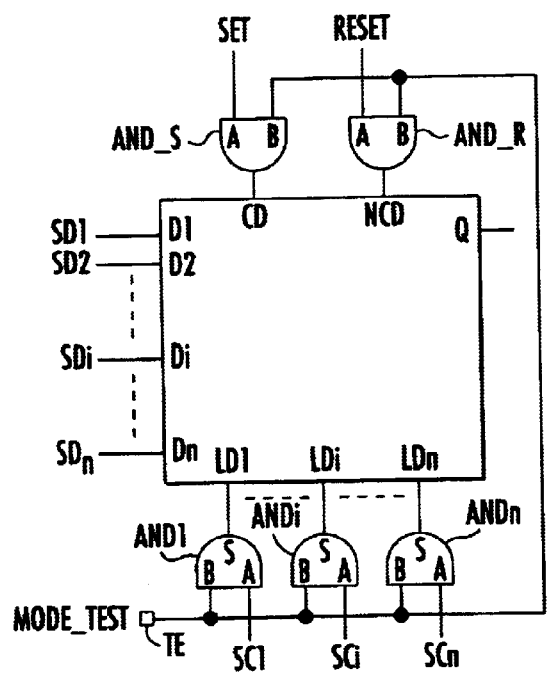
FIG. 5
FIG. 4

FAULT DETECTION METHOD FOR ELECTRONIC CIRCUIT

FIELD OF THE INVENTION

The present invention relates to electronic circuits and, more particularly, to a method and circuit for testing an electronic device.

BACKGROUND OF THE INVENTION

Within the meaning of the invention and in what follows, the term "electronic circuit" is to be understood in its broadest sense. Among others, it encompasses any discrete component (packaged), any assembly of such components mounted on a printed circuit type of support to form a functional unit, any unitary component implanted on a semiconductor substrate ("on chip device") and any assembly of such components.

By definition, the terms "logic state", or more simply "state", designate the electrical voltage level at a node with respect to ground. By extension, these terms also designate the electrical voltage level with respect to ground of a logic signal applied to, or delivered by, a node. In binary logic, there exist two different set states denoted 1 and 0 depending on whether the node or signal voltage is respectively equal to a supply potential (generally positive) or zero. In electronic circuits, the logic is generally a positive logic, i.e. a signal is considered to be active if it is in the 1 state. In what follows, it shall be assumed that such is the case. Moreover, if a signal applied to an input is active, this input shall sometimes be referred to as being active. Likewise, the action of applying an active signal to an input shall be referred to as activating that input.

The function of digital electronic circuits is defined by the relationship between the states of some nodes of the circuit, referred to as inputs and outputs. This relationship between the state of the inputs and the state of the outputs is commonly expressed in the form of a table known as a truth table.

The invention applies to an electronic circuit having n control inputs and p data inputs, and at least one output. In general, though not always, the numbers n and p are equal. The circuit serves both to select a data input as a function of the state of the control inputs (data input multiplexing) and to store the state of the selected data inputs. The state of the last selected input is delivered by the output between two selections. At least one control input is associated with each data input in order to achieve the input data selection function.

The inputs are activated by the level of the signals applied thereto, and not by the edges (transitions from one logic state to another) of those signals. This type of circuit comprises means for imposing the state of a data input. These means are generally activated only when there is generated a control signal for the control input associated with that input. Indeed, the state of the data input at other instants is irrelevant. In other words, it is impossible to control the state of a data input without generating a control signal for the associated control input. Moreover, it is impossible to control the state of all the data inputs at any one time. Rather, it is only possible to control the state of one data input at a time. Similarly, such a type of circuit comprises means for observing the state of the output which, in general, are only activated when there is generated a control signal for a control input.

FIG. 1 shows an example of such a circuit, which is here a multiplexed flip-flop or latch 100 having two data inputs D1 and D2, two control inputs LD1 and LD2 associated with D1 and D2 respectively, and an output Q. During normal operation of this circuit when only one of the control inputs LD1 or LD2 is active (i.e. in the 1 state) and not the other, output Q passes to the state—1 or 0—of the associated data input, respectively D1 or D2. This is the selection or multiplexing function of the circuit. When the control input that was active returns to 0, the output maintains that state until a control input is again activated. This is the memory function of the circuit.

When the two control inputs are simultaneously activated, the voltage at output Q takes on an indeterminate value because there arises an internal conflict within the circuit. The output then takes on an arbitrary state 1 or 0 depending, among other things, on the state of the data inputs. However, it is impossible to determine that level beforehand. This is why the output is considered to be in an indeterminate (or "unknown") state identified by the symbol X in the technical literature.

When none of the control inputs is active, the output Q remains in the state it was in previously. This is the memory function of the circuit.

This normal operation is summarised in the truth table of FIG. 2. In this table, the index n−1 designates the prior state of output Q.

A classical failure is when a circuit node enters into a set state—1 or 0—irrespective of the state of the other nodes to which it is functionally connected. This results from an electrical fault in the circuit, such as a short circuit between the node and the power supply or ground due, for example, to a speck of dust having settled on a mask during the doping stage of the circuit manufacturing process. Such a fault is described as a node sticking to a given state 1 or 0.

For circuits whose inputs are activated by signal edges, it is quite simple to detect a node sticking to a given state 1 or 0. Indeed, in such a sticking state there is no transition from one logic level to another, and this is quite easily detectable. On the other hand, with circuits whose inputs are activated by a voltage level, these faults are more difficult to detect.

Digital electronic circuits are tested using test instruments which generally call upon an automatic test pattern generating program. A test pattern is a set of signals having determined states. The program simulates the most probable faults and generates a sequence of test vectors adapted to reveal these faults. These patterns are applied to the inputs of the electronic circuit under test. Faults can be detected by observing the state of the output(s). Test instruments are based on the theory that there can be one and only one input or output at a time which is stuck on state 1 or 0.

It is known to insert in the electronic circuit some circuits dedicated to the test function, such as test cells complying to IEEE std. 1149.1b-1994, which allow test patterns to be applied to the inputs and the outputs to be observed in a specific circuit operating mode, known as the test mode. A specific serial input and serial output are then necessary for implementing the test mode according to a method known as the boundary scan test.

To avoid having to implant such circuits dedicated to the test function (which on their own can account for 20% of the chip area occupied by the circuit), it is desirable to be able to detect these faults by making the circuit operate in the normal manner. Now, it will be recalled that for a circuit such as the one shown in FIG. 1, it is in general impossible to control the state of a data input without generating a control signal for the associated control input.

It is then easy to detect a control input which is stuck at 0. All it takes is to generate a first and then a second test pattern, with a control signal applied to that control input which is in the 1 state in the two test patterns, and a data signal on the associated data input which changes state from one pattern to the other. If the output Q does not change state in response to the change of state of the data signal, this means that the corresponding control input is stuck at 0. This test is therefore easily implemented by test instruments.

On the other hand, known test instruments are unable to detect whether a control input is stuck in the 1 state. Indeed, if this control input is activated, the output Q passes to the state of the associated data input exactly as if there were no fault. The fault is therefore not detected. Moreover, if another control input were activated, the output Q would be in the unknown state X, since the two control inputs are simultaneously in the 1 state. Now, known test instruments do not consider that an X state reveals a circuit fault. It is thus impossible to detect a fault in this manner.

SUMMARY OF THE INVENTION

An object of the invention is to provide a method and device for detecting the sticking in the 1 state of a control input of an electronic circuit such as a multiplexed latch, having n control inputs and p data inputs and at least one output.

In accordance with the invention, this object is achieved by a fault detection method for an electronic circuit comprising control inputs and data inputs, each of which is associated with a control input, and at least one output storing the state of a determined data input or a determined logic state 1 or 0, as a function of the state of control signals applied to the control inputs.

The method includes applying a control signal to an arbitrary control input of the circuit and, as the case arises, a data signal to the associated data input, these signals being adapted to set the output of the circuit to a determined state, referred to as the start state. The method further includes inhibiting the control inputs of the circuit and, for each control input, applying a control signal to said control input and also applying a data signal to the data input associated with that control input. The control and data signals are adapted to modify the output state of the circuit with respect to the start state. The method also comprises observing the state of the output of the circuit to deduce therefrom, in the case of a change of state, the sticking at 1 of a control input.

The method thus involves attempting to make the electronic circuit operate so as to modify the output state with respect to the start state, knowing that if the output state does indeed change while the control inputs are inhibited, then at least one control input is stuck at state 1. This operating simulation thus makes it possible to detect such a sticking fault. It matters little to know precisely which is the control input concerned by this fault. Indeed, if the electronic circuit exhibits such a fault, it is discarded from the batch of circuits under test and destroyed. Note that since the circuit is made to operate so as to modify the output state with respect to the start state, the output state may be observed using a test instrument. Hence, a possible change of state at the output concerned may be detected, revealing that a control input is stuck at state 1.

BRIEF DESCRIPTION OF THE DRAWINGS

Other characteristics and advantages of the invention shall become more apparent from reading the following description. The description is to be read in conjunction with the appended drawings in which:

FIG. 1, already described, is a diagram of a prior art multiplexed latch with two control inputs, two data inputs and an output;

FIG. 2, already described, is the truth table for the multiplexed latch of FIG. 1;

FIG. 3 is a diagram of a multiplexed latch having n control inputs, p data inputs and an output (with n=p) according to the present invention;

FIG. 4 is a diagram of multiplexed latch having n control inputs, p data inputs and an output (with $n^1 p$) according to the present invention; and FIG. 5 is a diagram of a control device of a multiplexed bus device according to the present invention.

DETAILED DESCRIPTION OF THE PREFERRED EMBODIMENTS

FIG. 3 shows the diagram of a first example of an electronic circuit that can be tested in accordance with the teachings of the invention. The circuit is a multiplexed latch of a classically known type. This latch comprises: n control inputs identified by reference numerals $LD1, \ldots, LDi, \ldots, LDn$; p data inputs (with n=p) identified by reference numerals $D1, \ldots, Di, \ldots, Dn$; and an output identified by reference Q.

This electronic circuit is completed in accordance with the invention by a device comprising AND-type logic gates with two inputs denoted A and B and one output denoted S. There are as many of these logic gates as there are control inputs, i.e. there are n such logic gates. These logic gates are identified by reference numerals $AND1, \ldots, ANDi, \ldots ANDn$.

Each logic gate is connected in the following manner. The output S of a gate ANDi is connected to one of the control inputs LDi of the latch. Its first input A receives a control signal SCi and its second input B receives a test signal.

In the preferred embodiment, which is the only one shown in the figures, the second input B of each logic gate is connected to a common node TE so as to receive one and the same test signal denoted MODE_TEST. However, it would be feasible to provide an independent test signal for each logic gate.

When the signal MODE_TEST is at logic 0, the control inputs LDi are inhibited, i.e. they are theoretically maintained at logic 0 (except of course in the case where they are stuck at logic 1) irrespective of the control signals SCi that are generated and applied to the input A of the gates ANDi if the case arises. In other words, the function of the gates ANDi connected in the manner described above is to apply or not apply the control signals SCi at the control inputs LDi as a function of the test signal MODE_TEST. More generally, it can be said that the control inputs LDi are inhibited or not inhibited as a function of the test signal MODE_TEST.

The above-described device implements the fault detection process according to the invention. The test for determining the possible sticking at logic 1 of any control input LDi is performed as follows.

The MODE_TEST signal is initially set at logic 1. Accordingly, the control signals SCi generated and applied as the case may be to the input A of gates ANDi are also applied to the control inputs LDi of the circuit.

In a first step, a control signal is applied to an arbitrary control input of the circuit and, if necessary, a data signal is applied to the corresponding data input. These signals are adapted to set the circuit output to a determined state, referred to as the start state. In the example, the start state is the 0 state. Of course, if another control input is stuck at logic 1, the output Q of the circuit does not go into the determined state (start state) but takes on a "unknown" state. As will become clear further, this is not a bar to the process.

In a second step, the control inputs LDi are inhibited. In the preferred—but non limiting—embodiment, this result is obtained by causing the MODE_TEST signal to pass to logic 0. It is possible not to inhibit all the control inputs simultaneously. Nevertheless, this brings no advantage. Conversely, it is simpler to inhibit them all at the same time with the MODE_TEST signal.

In a third step, for a first inhibited control input, e.g. LD1, a control signal is applied to the control input LD1 and a data signal SD1 is applied to the corresponding data input D1, these signals being adapted to modify the state of the latch's output Q with respect to the start state. In other words, if the start state is at logic 0, (i.e. if the output Q is supposed to be at state 0), the signal SD1 is at state 1 and vice versa. In the case where not all the control inputs are inhibited, care must be taken not to simultaneously activate another control input which is not inhibited. It will appear that a data signal is not necessarily required when the circuit does not comprise a data input associated with the control input (see description of FIG. 4, below).

Finally, in a fourth step, the state of output Q is observed to deduce therefrom that, in the event of a change of state, one of the control inputs is stuck at 1. Indeed, if the output Q changes state while, among others, the control input LD1 is inhibited (i.e. it continuously receives a signal at state 0), this would mean that this control input LD1 or another control input is in fact stuck at 1. It would show a fault.

The third and fourth steps are successively reiterated for all the circuit's control inputs. It was hypothesised further above that one and only one control input at a time can exhibit the fault of being stuck at 1. Following this hypothesis, it can be ascertained that a change of state of the output necessarily occurs at one of those iterations should one of the control inputs be stuck at 1. This remains true even if, following the first step, the output Q were in the unknown state X instead of being at the intended start state.

In FIG. 4 where the same elements as in FIG. 3 have the same references, there is shown the diagram of a second example of an electronic circuit that can be tested in accordance with the teachings of the invention. This example also relates to a multiplexed latch having n control inputs, p data inputs and an output. However, this latch distinguishes from that of FIG. 3 in that n is not equal to p (i.e; $n^1 p$).

Indeed, the latch of FIG. 4 comprises one or a number of control inputs that are not associated with a data input, in addition to the n control inputs LD1, ..., LDi, ..., LDn associated with the n respective data inputs D1, ..., Di, ..., Dn. These control inputs generally include an input CD for setting to 1 the latch output Q and/or an input NCD for setting to 0 the latch output Q. In this case, there is the following relation: n=p+2. These extra control inputs are classical in electronic circuits such as latches. They allow the latch output to be set to a determined state independently of the state of the data inputs. Of course, it is quite feasible to have just one of these control inputs NC or NCD independently of the other.

In accordance with the invention, two AND gates AND_S and AND_R having two inputs and one output, similar to the above-described gates AND1 to ANDn, are connected by their outputs S respectively to the control input CD and the control input NCD. These gates receive the MODE_TEST signal at their input B. The input A of gate AND_S receives a SET signal. The latter is a signal setting the latch output Q to 1. Likewise, the input A of gate AND_R receives a RESET signal. The latter is a signal setting the latch output Q to 0.

In order to detect whether any one of these inputs is stuck at 1, the start state of the latch output Q must be chosen as a function of the effect produced by the activation of that control input. More specifically, with respect to the CD input setting the latch output to 1, the start state of the latch output Q must be at state 0. With respect to the NCD input setting the latch output to 0, the start state of the latch output Q must be at state 1. As will have been understood, this ensures that a change of output state is detected when the corresponding control input is stuck at 1. Indeed, insofar as no data input is associated with the control input, no data signal can be applied to obtain this result as a function of the determined state 1 or 0 of the output Q chosen as the start state.

Naturally, with the circuit of FIG. 4 too it is possible that the state of output Q after the first step is not the intended start state (owing to another control input being stuck at 1). However, as with the circuit of FIG. 3, this is not prohibitive.

FIG. 5, in which the same elements as in FIG. 3 have the same references, shows the diagram of a third electronic circuit that can be tested in accordance with the teachings of the invention. The circuit in question is a multiplexed bus identified by reference TB.

Such a device comprises a transmission line TL, to which are connected the outputs of a plurality of tristate gates denoted TS1, ..., TSi, ..., TSn. Such a gate (for instance, gate TS1) comprises a control input C, a data input D and an output Y. When the control input C is at state 0, output Y is in a high impedance state, denoted HIZ in the technical literature. When the control input is at state 1, output Y takes on the state 1 or 0 of the data input D. For the sake of clarity, inputs C and D as well as output Y of the other gates are not shown in FIG. 5.

The outputs of all the gates are connected to the transmission line TL. In general, line TL is joined to two inverters I1 and I2 connected in parallel and head to tail relative to one another (as shown in FIG. 5). These two inverters serve for shaping the signal sent along the line TL, taking into account possible perturbations on the line. Moreover, they form a means for storing the logic state of the transmission line; that is, when the control input of a gate TSi that was at state 1 passes to state 0, the transmission line does not pass to the HIZ state but stores the state of the input Di of that gate.

Each data input Di receives a data signal SDi and each control input LDi receives a control signal SCi. Only one of the data signals SDi is sent along the transmission line TL as a function of the state of the control signals SDi.

Such a device TB, whose contour is symbolically indicated in broken lines in FIG. 5, can be perceived as comparable to the latch of FIG. 3. Firstly, the data inputs Di (or the control inputs LDi respectively) of the gates TSi in FIG. 5 are comparable to the data inputs Di (or the control inputs LDi respectively) of the latch shown in FIG. 3. Secondly, an end Q of the transmission line TL of the device shown in FIG. 5 (such an end being intended for connection to a distant application) can be assimilated to the output Q of latch shown in FIG. 3.

It goes without saying that the invention is not limited to the examples of the electronic circuits described above. It can validly be applied to any comparable electronic circuit.

What is claimed is:

1. A fault detection method for an electronic circuit comprising control inputs, data inputs associated with the control inputs, and at least one output storing the state of a data input as a function of a state of control signals applied to the control inputs, the method comprising:

providing a plurality of logic gates each having first and second inputs and an output and connecting each output to a respective control input, each first input to a respective control signal, and each second input to a test signal;

applying a control signal to a predetermined control input via a respective logic gate and a data signal to the associated data input to set the output to a start state;

inhibiting the predetermined control input by applying the test signal to the respective logic gate connected thereto and applying a data signal to the data input associated with the predetermined control input to modify an output state with respect to the start state; and observing the output to deduce sticking of the predetermined control input based upon a change of state of the output.

2. The method according to claim 1 further comprising repeating the inhibiting and observing steps for each other control input.

3. The method according to claim 1 wherein the inhibiting further comprises inhibiting all of the control inputs simultaneously.

4. The method according to claim 1 wherein the output in the start state is 0, and wherein the output after the inhibiting and applying is 1.

5. The method according to claim 1 wherein the output in the start state is 1, and wherein the output after the inhibiting and applying is 0.

6. The method according to claim 1 wherein each logic gate comprises an AND logic gate.

7. The method according to claim 1 wherein the electronic device comprises a multiplexed latch.

8. A circuit comprising:
an electronic circuit comprising control inputs, data inputs associated with the control inputs, and at least one output storing the state of a data input as a function of a state of control signals applied to the control inputs; and a fault detector connected to said electronic circuit for
applying a control signal to a predetermined control input and a data signal to the associated data input to set the output to a start state, and
inhibiting the control inputs and applying a data signal to the data input associated with the predetermined control input to modify an output state with respect to the start state so that a change of state of the output indicates sticking of the predetermined control input;
said fault detector comprising a plurality of logic gates each having first and second inputs and an output, each output being connected to a respective control input, each first input receiving a respective control signal, and each second input receiving a test signal, said logic gates inhibiting each respective control input as a function of the state of the test signal.

9. The circuit according to claim 8 wherein each logic gate comprises an AND logic gate.

10. The circuit according to claim 8 wherein all of the second inputs are connected to a common node receiving the test signal.

11. The circuit according to claim 8 wherein said fault detector further inhibits all of the control inputs simultaneously.

12. The circuit according to claim 8 wherein the output in the start state is 0, and wherein the output after the inhibiting and applying is 1.

13. The circuit according to claim 8 wherein the output in the start state is 1, and wherein the output after the inhibiting and applying is 0.

14. The circuit according to claim 8 wherein the electronic device comprises a multiplexed latch.

15. The circuit according to claim 14 further comprising a first additional control input for setting the output of said multiplexed latch to a first logic state, and a second additional control input for setting the output of said multiplexed latch to a second logic state.

16. The circuit according to claim 8 wherein the electronic circuit comprises a multiplexed bus device.

17. The circuit according to claim 16 wherein said multiplexed bus device comprises:
a transmission line; and
a plurality of tristate gates each having an output connected to said transmission line, an input for receiving a control input, and a data input for receiving a data signal, said plurality of tristate gates allowing only one of the data signals to be transmitted along said transmission line as a function of the control signals.

18. A circuit comprising:
a multiplexed latch comprising control inputs, data inputs associated with the control inputs, and at least one output storing the state of a data input as a function of a state of control signals applied to the control inputs; and a fault detector connected to said multiplexed latch and comprising a plurality of AND logic gates each having first and second inputs and an output, each respective output being connected to a control input, each first input receiving a control signal, and each second input receiving a test signal, said AND logic gates inhibiting each respective control input as a function of the state of the test signal.

19. The circuit according to claim 18 wherein all of the second inputs are connected to a common node receiving the test signal.

20. The circuit according to claim 18 wherein said fault detector further inhibits all of the control inputs simultaneously.

21. The circuit according to claim 18 further comprising a first additional control input for setting the output of said multiplexed latch to a first logic state, and a second additional control input for setting the output of said multiplexed latch to a second logic state.

22. A fault detector for an electronic circuit comprising control inputs, data inputs associated with the control inputs, and at least one output storing the state of a data input as a function of a state of control signals applied to the control inputs, the fault detector comprising:
a circuit for applying a control signal to a predetermined control input and a data signal to the associated data input to set the output to a start state, and inhibiting the control inputs and applying a data signal to the data input associated with the predetermined control input to modify an output state with respect to the start state so that observing the output permits deduction of sticking of the predetermined control input based upon a change of state of the output;
said circuit comprising a plurality of logic gates each having first and second inputs and an output, each output being connected to a respective control input, each first input receiving a respective control signal, and each second input receiving a test signal, said logic gates inhibiting each control input as a function of the state of the test signal.

23. The circuit according to claim 22 wherein each logic gate comprises an AND logic gate.

24. The circuit according to claim 22 wherein all of the second inputs are connected to a common node receiving the test signal.

25. The circuit according to claim 23 wherein said fault detector further inhibits all of the control inputs simultaneously.

26. The circuit according to claim 23 wherein the electronic device comprises a multiplexed latch.

27. The circuit according to claim 26 further comprising a first additional control input for setting the output of said multiplexed latch to a first logic state, and a second additional control input for setting the output of said multiplexed latch to a second logic state.

28. The circuit according to claim 23 wherein the electronic device comprises a multiplexed bus device.

29. The circuit according to claim 28 wherein said multiplexed bus device comprises:
 a transmission line; and
 a plurality of tristate gates each having an output connected to said transmission line, an input for receiving a control input, and a data input for receiving a data signal, said plurality of tristate gates allowing only one of the data signals to be transmitted along said transmission line as a function of the control signals.

* * * * *